United States Patent [19]

Brown et al.

[11] Patent Number: 4,746,547

[45] Date of Patent: May 24, 1988

[54] METHOD AND APPARATUS FOR CIRCULATING BED COATER

[75] Inventors: Lloyd C. Brown; Charles C. Adams, both of San Diego; Gottfried E. A. Besenbruch, Solana Beach, all of Calif.

[73] Assignee: GA Technologies Inc., San Diego, Calif.

[21] Appl. No.: 946,818

[22] Filed: Dec. 29, 1986

[51] Int. Cl.$^4$ .......................... B05C 3/04; B05C 3/08; B05C 19/02; B05D 1/22
[52] U.S. Cl. .................................. 427/213; 118/303; 118/DIG. 5; 427/255.1; 427/345

[58] Field of Search ......... 118/417, 418, 303, DIG. 5; 427/213, 242, 255.1, 345

[56] References Cited

U.S. PATENT DOCUMENTS 4,542,043 9/1985 Abe et al. .............................. 427/213
4,594,270 6/1986 Brooks ................................. 427/213

Primary Examiner—Michael R. Lusignan
Attorney, Agent, or Firm—Fitch, Even, Tabin & Flannery

[57] ABSTRACT

This invention relates to particle coaters and in particular to a method and apparatus for a circulating bed particle coater which is particularly adapted for coating small diameter particles.

10 Claims, 1 Drawing Sheet

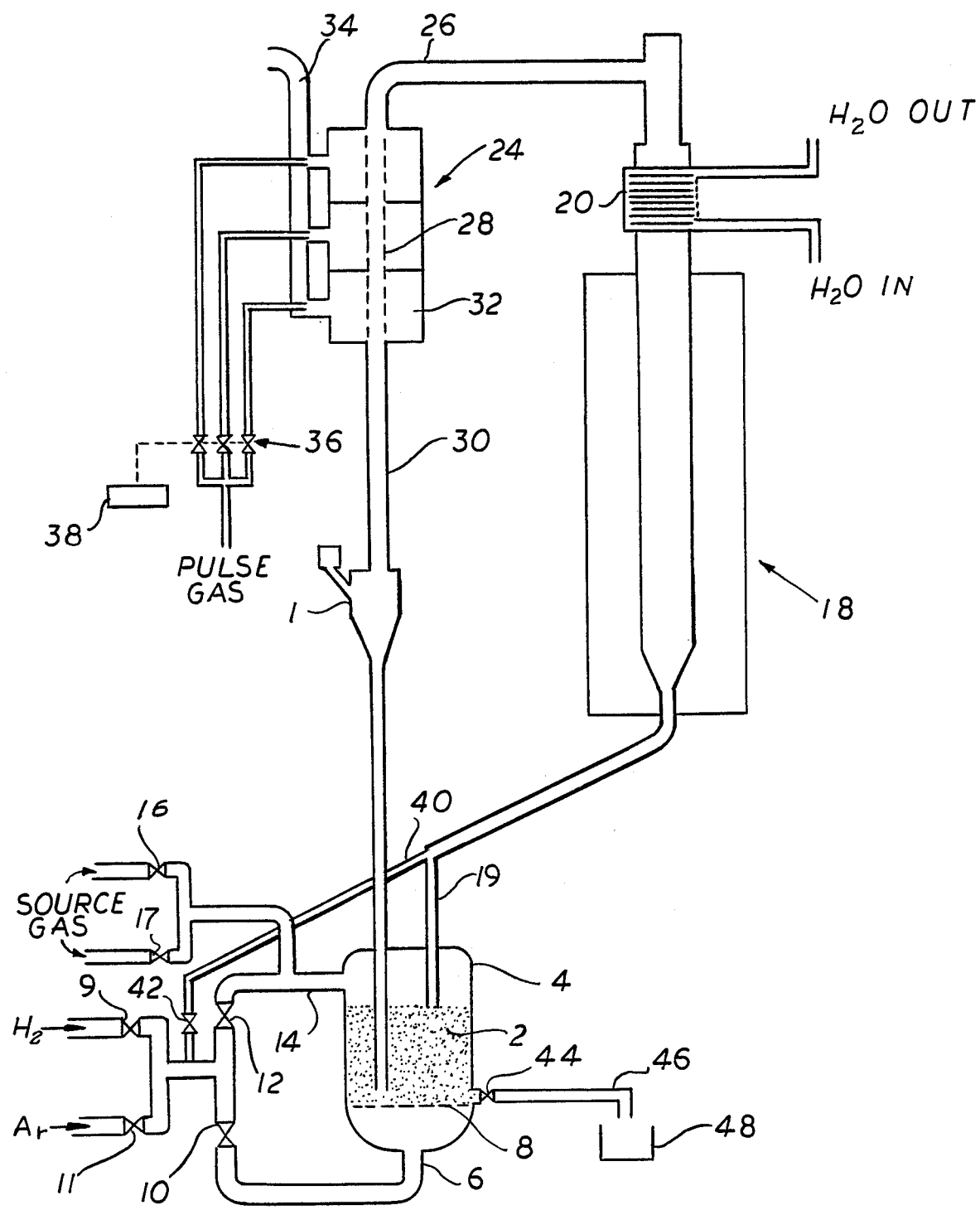

METHOD AND APPARATUS FOR CIRCULATING BED COATER

BACKGROUND OF THE INVENTION

Fluidized bed systems are very effective in coating particles having sizes greater than a few hundred microns. Coating of particles having dimensions smaller than 100 microns in a fluidized bed has been attempted but has not been commercially successful due to the fact that when small particles are attempted to be coated the fluidizing gas flow rates have to be reduced to such an extent that sufficient mixing does not occur and particles stick together.

SUMMARY OF THE INVENTION

The present invention is directed to a circulating bed coating apparatus and method for coating small particles with the decomposition product of a decomposable coating gas. The coating gas may be mixed with a diluent gas to form a transport gas.

The apparatus includes a fluidized bed for fluidizing the particles to be coated, furnace spaced from the fluidized bed for heating a flowing stream of decomposable transport gas and particles to above the decomposition temperature of the decomposable gas, means for separating the particles from the spent gas stream exiting the furnace and means for reintroducing the particles into the fluidized bed.

In accordance with the disclosed method the particles to be coated are suspended in a fluidized bed. A portion of the suspended particles are entrained in a flowing stream of decomposable gas which is passed through the fluidized bed. The flowing stream of decomposable gas and entrained particles is passed into a furnace where the gas decomposes and coats the particles. The particles are then separated from the stream of exhaust gases exiting the furnace and returned to the fluidized bed where they are again entrained in the stream of decomposable gas and circulated through the system.

BRIEF DESCRIPTION OF THE DRAWING

The FIGURE is a schematic view of a preferred embodiment of the apparatus which is the subject of this invention.

PREFERRED EMBODIMENT OF THE INVENTION

A preferred embodiment of this invention can be described by reference to the FIGURE. Prepressurized decomposable gas or a mixture of gases are introduced through valves 17 and/or 16. The decomposable gas is preferably mixed in line 14 with a diluent gas or gases supplied through valves 9 and/or 11. Suitable diluent gases include argon, nitrogen, helium, and hydrogen. The small particles to be coated are loaded through loader 1 into a fluid bed 4, which is preferably a fluidized bed, although other entrainment means could be utilized. The particles form a fluidized bed 2 by the injection of a fluidizing gas beneath porous filter or frit 8 at the bottom of the unit 4. As shown in the FIGURE, the fluidizing gas is preferably, but not necessarily, the diluent gas which is controlled by valves 10 and 12. In this preferred embodiment, a nonreactive gas such as argon may be introduced into line 13 as a levitating gas.

In other embodiments, the levitating gas may be the decomposable gas.

The transport gas entrains a portion of the fluidized particles in the bed 2 and exits the fluidizing unit 4 via line 19. The transport gas stream and entrained particles are passed through a furnace 18 where they are heated to above the decomposition temperature of the decomposable gas fraction of the transport gas causing coating of the particles with the decomposition products.

The transport gas stream exiting the furnace 18 consists of the exhaust gases resulting from the decomposition and having the coated particles entrained therein. The exhaust gas transport stream is preferably, but not necessarily, cooled by a suitable cooling unit 20 to a temperature below the decomposition temperature to terminate coating of the entrained particles and the exhaust gas and entrained particles are delivered via line 26 to a suitable particle separator 24.

The particle separator 24 may be of conventional design. In the embodiment illustrated in the FIGURE, the particles pass straight through separator 24 into a return line 30. The exhaust gas passes through the filter spaces in tubular filter 28 into segmented outlet spaces 32 and out the outlet line 34 which is maintained at a negative pressure relative to the pressure in the separator 24. The tubular filter is cleared one segment at a time by high pressure (approximately 100 psig) pulse gas supplied through valves 36 controlled by valve sequencer 38 in accordance with known practices Alternatively, the separator could be a cyclone separator constructed according to guidelines set forth in *Chemical Engineers Handbook*, Fourth Edition, R. H. Perry, C. H. Chilton, S. D. Kirkpatrick, editors, FIG. 20–86, pages 20–69. A blowback filter as described on pages 20–81 of the above handbook could also be used.

As shown in the FIGURE, the return line 30 extends into the fluidizing unit 4 and terminates a short distance above the filter 8. Accordingly, the particles will accumulate in the lower portion of the return line before returning to the fluidized bed and act to prevent backflow in return line 30. A booster flow pipe 40 and valve 42 may be installed to assure any tendency toward reverse flow.

At the end of the coating cycle, the coated particles are removed through valve 44 and line 46 into hopper 48.

It has been discovered that small diameter particles, for example those having a particle size of less than 100 microns, and particularly those having a particle size of less than 40 microns, can be effectively coated when the coating step takes place in a region where the particles are highly agitated as compared to the degree of agitation that typically occurs in a fluidized bed. Typical levitating gas flow rates for establishing a fluidized bed of, for example, 10 micron diameter nickel particles range between about 0.1 and about 0.3 l/min/square centimeter of bed cross-section. At those flow rates there is insufficient agitation of the particles and when coating is attempted in the fluidized bed agglomeration of the particles occurs.

In accordance with the present invention, agglomeration is avoided by entraining a portion of particles from a fluidized bed maintained under conditions where coating does not occur, rapidly transporting the entrained particles through a furnace under highly agitated conditions such that agglomeration does not occur. In order to achieve the necessary agitation, the flow rate of the transport gas is high and residence time in the furnace is relatively short, for example between about 0.1 and about 0.5 seconds. As might be expected, this is insufficient to obtain uniform pin hold free coating which necessitates that the particles be recirculated as described herein or that a number of furnaces in series be employed or that a furnace of extreme length be employed. From a practical point of view, recirculating the particles from the fluidized bed through one or possibly a few furnaces is the most economical.

The transport gas flow rate necessary to insure sufficient agitation to prevent agglomeration may vary widely depending upon system design, cross-section size of the furnace, particle size and density of the particles being coated. Generally, the transport gas flow rate should exceed 30 l/min per square centimeter of furnace cross-section where the coating takes place. In an apparatus such as illustrated in the FIGURE, using a laboratory tube furnace having a cross-sectional area of 2.88 square centimeters transport gas flow rates of between about 15 and about 60 l/min/square centimeter of furnace cross-section have been found to be acceptable to prevent agglomeration. It should be noted that the particles need to be under high agitation only in those portions, i.e., in the furnace, of the system where decomposition and coating of the particles occurs. Accordingly, in the FIGURE the highly agitated condition need not be maintained in lines 19 and 26 or in return line 30. However, as a practical matter, a highly agitated condition is generally maintained in lines 19 and 26 as well as in furnace 18.

The following examples outline various embodiments of the present invention:

EXAMPLE I

A 0.75 inch internal diameter tube was used in a resistance heated Linberg laboratory tube furnace (3-inch P.D.) Model 54352. The tube was heated to 700° C. by way of an external resistance heated furnace operating at 800° C. Argon gas at a flow rate of 5 l/min was used to purge the reactor during heat-up.

Seven hundred grams of spherical nickel particles with an average diameter of 10 $\mu$m were added to the fluidized bed mixing unit. When the furnace had reached 700° C. operating temperature the argon gas purge was replaced with hydrogen gas at a total gas flow rate of 90 l/min. Ten percent of the hydrogen gas was directed through the porous frit at the bottom of the fluidizing unit to fluidize the nickel particles. The remaining hydrogen gas (81 l/min.) was mixed with gas (SiH$_4$) at a flow rate of 3 l/min. This gas mixture was injected into the fluidized bed entrainment unit near the top of the fluidized bed entrainment unit near the top of the fluidized nickel particle bed. Nickel particles were entrained in the transport gas mixture and transported into the hot furnace. Thermal decomposition of the SiH$_4$ gas occurs with the formation of the solid silicon metal which plated out on the nickel particles in the solid/gas mixture producing a silicon coating on the particles. The solid/gas mixture exiting the hot reactor was cooled by passage through a cooling unit and the cooled material was passed through a solid-gas separator. The solid particles were recirculated through the return downflow pipe to the fluidized bed mixing unit where fresh SiH$_4$ and hydrogen gas were mixed and the solid/gas mixture was reinjected through the reactor for additional coating.

Coating was carried out for six hours to product Si metal coatings 2 microns thick on the nickel particles.

EXAMPLE II

The apparatus and operation are substantially the same as Example 1, except for the noted exceptions. The source gas is nickel carbonyl. The substrate is 40 micron alumina spheres. The tube furnace is operated at slightly less than 200° C. The gas used for levitation and transport is carbon monoxide. The nickel carbonyl flow rate is less than 1 liter per minute.

Other coatings can be made using the source gases indicated in the following table:

| Coating | Source Gas or Gases | Temperature of Furnace |
|---|---|---|
| W | WCl$_6$ or WF$_6$ + 3 H$_2$ | 900–1500 |
| Al | Al(CH$_3$)$_3$ + H$_2$ | 200–400 |
| Co | CoCl$_3$ + 3 H$_2$ | 300–1400 |
| Fe | Fe(CO)$_5$ | |
| WC | WCl$_6$ or WF$_6$ + Proplyene + H$_2$ | 900–1500 |
| Ga As | Arsine + GaH$_6$ | |
| SiC | CH$_3$ Si Cl$_3$ | 1600–1800 |
| C | Acetylene | 1200–1900 |
| | Benzene | 600–800 |
| | Propylene | 1300–1600 |
| | or | |
| | Methane | 1200–2000 |

EXAMPLE III

The powder injection system was loaded with 1108 grams of 5 to 9 micron iron particles. The power to the reactor was turned on and the control temperature was set to 330° C. An argon purge of 6 liter/minute was started through the reactor. An additional argon flow (0.5 liter/minute) was started through the frit of the particle injection system to fluidize the iron particles which were entrained into the argon reactor flow and carried through the heated reactor tube. After the reactor temperature reached 282° C. silane gas was slowly mixed with the iron particle and argon gas mixture and the three component mixture was injected through the hot reactor furnace. Decomposition of the silane and plateout of silicon metal on the iron particles occurred. The exiting argon and hydrogen gases with entrained iron particles were passed through the cyclone separator and the sintered metal filter. The partially coated iron particles were separated from the exhaust gas and re-directed down to the particle injector system where they were again entrained, mixed with fresh silane gas, and passed through the hot reactor. The reactor temperature was slowly raised to 356° C. and the silane gas flowrate was increased from 0.5 liter/minute to 2.0 liter/minute over the duration of the coating process. The coating process continued for several hours until sufficient silane had been added to deposit 0.5 microns of silicon metal on the surface of the iron particles.

After completing the deposition of silicon metal on the iron particles, the reactor power was turned off and the silicon coated iron particles were allowed to cool to ambient temperature and the coated material was unloaded. Exposing the silicon coated iron particles to concentrated HCl acid for 24 hours showed no loss in particle weight confirming that the iron particles were coated with an impermeable layer of silicon metal.

what is claimed is:

1. A method for coating small particles comprising:
    A. establishing a fluidized bed reservoir of particles to be coated, B. entraining a portion of the fluidized particles in the reservoir in a flowing transport gas stream to provide a mixture of transport gas and entrained particles, said transport gas stream including a decomposible gas fraction, C. transporting the mixture of transport gas and entrained particles from the fluidized bed through a furnace spaced from the reservoir at a flow rate sufficient to prevent agglomeration of the particles, D. heating the mixture of transport gas and entrained particles in the furnace to above the decomposition temperature of the decomposible gas.

E. separating the particles from the exhaust transport gas, and

F. reintroducing the particles into the fluidized bed reservoir.

2. The method of claim 1 wherein the particles have a particle size of less than about 100 microns.

3. The method of claim 1 wherein the particles have a particle size of less than about 40 microns.

4. The method of claim 3 wherein the mixture of transport gas and entrained particles has a flow rate of between about 15 and about 60 l/min/cm$^2$.

5. The method of claim 3 wherein the mixture of transport gas and entrained particles has a flow rate in excess of 30 l/min/cm$^2$.

6. The method of claim 3 wherein the particles are recirculated until a pinhole free coating is obtained.

7. The method of claim 4 wherein the decomposable gas is selected from triethyl aluminum and hydrogen, trimethyl aluminum and hydrogen, arsine and $Ga_2H_6$, silane, methyl trichlorosilane, benzene, acetylene, propylene and methane.

8. Apparatus for coating small particles comprising:

A. a fluidized bed reservoir particles to be coated,

B. means for introducing and withdrawing from the fluidized bed reservoir a transport gas stream for entraining a portion of the particles in the reservoir.

C. heater means for heating the flowing mixture of a transport gas and entrained particles, D. separator means for separating the particles from the exhaust transport gas stream exiting the heater means, E. means for reintroducing the separated particles into the fluidized bed reservoir, F. and means for causing sufficient agitation of the flowing stream of transport gas and entrained particles in the heater means to prevent agglomeration of the particles.

9. The apparatus of claim 8 including means to cool the mixture of exhaust transport gas and entrained particles.

10. The apparatus of claim 8 wherein the heater means is a resistance heated tubular furnace.

* * * * *

UNITED STATES PATENT AND TRADEMARK OFFICE
CERTIFICATE OF CORRECTION

PATENT NO. : 4,746,547
DATED : May 24, 1988
INVENTOR(S) : Lloyd C. Brown; Charles C. Adams, Gottfried E.A. Besenbruch It is certified that error appears in the above-identified patent and that said Letters Patent is hereby corrected as shown below:

In the Claims: Column 6

In Claim 8, line 2, after "reservoir" insert --for--.

Signed and Sealed this

Twenty-fifth Day of October, 1988

*Attest:*

DONALD J. QUIGG

*Attesting Officer*  *Commissioner of Patents and Trademarks*